United States Patent
Lin

(10) Patent No.: US 12,453,079 B2
(45) Date of Patent: Oct. 21, 2025

(54) METHOD OF MANUFACTURING SEMICONDUCTOR STRUCTURE COMPRISING EDGE WORD LINE AND CENTRAL WORD LINE

(71) Applicant: NANYA TECHNOLOGY CORPORATION, New Taipei (TW)

(72) Inventor: Yu-Ting Lin, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 351 days.

(21) Appl. No.: 18/204,548

(22) Filed: Jun. 1, 2023

(65) Prior Publication Data
US 2024/0049452 A1   Feb. 8, 2024

Related U.S. Application Data

(62) Division of application No. 17/879,971, filed on Aug. 3, 2022, now Pat. No. 12,317,482.

(51) Int. Cl.
*H10B 12/00*   (2023.01)

(52) U.S. Cl.
CPC ........... *H10B 12/34* (2023.02); *H10B 12/053* (2023.02)

(58) Field of Classification Search
CPC ..... H10B 12/053; H10B 12/34; H10B 12/488
See application file for complete search history.

(56) References Cited

U.S. PATENT DOCUMENTS

2014/0213035 A1 *   7/2014   Park ................. H10D 30/63
                                                            438/424

FOREIGN PATENT DOCUMENTS

TW          I773625 B         8/2022

OTHER PUBLICATIONS

Office Action and and the search report mailed on Nov. 21, 2023 related to Taiwanese Application No. 112105864.

* cited by examiner

*Primary Examiner* — Nelson Garces
(74) *Attorney, Agent, or Firm* — Xuan Zhang

(57) ABSTRACT

A method of manufacturing a semiconductor structure and a semiconductor structure are provided. The method includes: providing a sacrificial structure disposed on a substrate; arranging a photomask to cover the sacrificial structure, wherein the photomask includes a plurality of transparent portions, a plurality of central opaque portions, at least one first edge opaque portion and at least one second edge opaque portion between the first edge opaque portion and the central opaque portions; removing portions of the sacrificial structure to form a plurality of central openings, at least one first edge opening and at least one second edge opening through the central opaque portions, the first edge opaque portion, the second edge opaque portion and the transparent portions; and forming at least one edge word line on the substrate through the second edge opening and forming a plurality of central word lines on the substrate through the central openings.

3 Claims, 22 Drawing Sheets

METHOD OF MANUFACTURING SEMICONDUCTOR STRUCTURE COMPRISING EDGE WORD LINE AND CENTRAL WORD LINE

CROSS-REFERENCE TO RELATED APPLICATION

This application is a divisional application of U.S. Non-Provisional application Ser. No. 17/879,971 filed 3 Aug. 2022, which is incorporated herein by reference in its entirety.

TECHNICAL FIELD

The present disclosure relates to a semiconductor structure and a method of manufacturing the same, and more particularly, to a semiconductor structure including word lines, and a method of manufacturing the same.

DISCUSSION OF THE BACKGROUND

Semiconductor structures are used in a variety of electronic applications, and the dimensions of semiconductor structures are continuously being scaled down to meet the current application requirements. However, a variety of issues arise during the scaling-down process and impact the final electrical characteristics, quality, cost and yield. Typical memory devices (such as dynamic random access memory (DRAM) devices) include signal lines, such as word lines and bit lines crossing the word lines. As DRAM devices are scaled down and the dimensions and/or pitches of the signal lines are getting smaller, the current leakage will be a critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor structure. The semiconductor structure includes a substrate, a plurality of central word lines and at least one edge word line. The substrate includes a plurality of central semiconductor portions spaced apart from each other and at least one edge semiconductor portion. The plurality of central word lines extend into the plurality of central semiconductor portions. The at least one edge word line extends into the at least one edge semiconductor portion. A width of the at least one edge word line is greater than a width of the plurality of central word lines.

Another aspect of the present disclosure provides a method of manufacturing a semiconductor structure. The method includes: providing a sacrificial structure disposed on a substrate; arranging a photomask to cover the sacrificial structure, wherein the photomask includes a plurality of transparent portions and a plurality of opaque portions, the plurality of opaque portions includes a plurality of central opaque portions, at least one first edge opaque portion and at least one second edge opaque portion between the at least one first edge opaque portion and the plurality of central opaque portions, and a width of the at least one second edge opaque portion is greater than a width of the at least one first edge opaque portion; removing portions of the sacrificial structure to form a plurality of central openings, at least one first edge opening and at least one second edge opening through the plurality of central opaque portions, the at least one first edge opaque portion, the at least one second edge opaque portion and the plurality of transparent portions; and forming at least one edge word line on the substrate through the at least one second edge opening and forming a plurality of central word lines on the substrate through the plurality of central openings.

Another aspect of the present disclosure provides a method of manufacturing a semiconductor structure. The method includes: providing a sacrificial structure disposed on a substrate; removing portions of the sacrificial structure to form a plurality of central openings, at least one edge opening and a plurality of pillars spaced apart from each other; forming a first material layer to cover the plurality of pillars, the plurality of central openings and a portion of the at least one edge opening, wherein a thickness of the first material layer is less than a height of the plurality of pillars; and forming at least one edge word line on the substrate through the at least one edge opening and forming a plurality of central word lines on the substrate through the plurality of pillars.

Another aspect of the present disclosure provides a method of manufacturing a semiconductor structure. The method includes: providing a sacrificial structure disposed on a substrate; removing portions of the sacrificial structure to form a plurality of central openings, at least one edge opening and a plurality of pillars spaced apart from each other; forming a first material layer to cover the plurality of pillars, the plurality of central openings and a portion of the at least one edge opening, wherein a thickness of the first material layer is less than a height of the plurality of pillars; and forming at least one edge word line on the substrate through the at least one edge opening and forming a plurality of central word lines on the substrate through the plurality of pillars.

In some embodiments, after forming the first material layer, the method further comprises: removing portions of the first material layer to expose top surfaces of the plurality of pillars and to form at least one through hole in the at least one edge opening.

In some embodiments, after exposing the top surfaces of the plurality of pillars, the method further comprises: removing the plurality of pillars to form a plurality of grooves, wherein the plurality of grooves includes a plurality of central grooves and a plurality of edge grooves, and the at least one through hole is between the plurality of central grooves and the plurality of edge grooves.

In some embodiments, after forming the plurality of grooves, the method further comprises: forming a second material layer to cover the plurality of edge grooves.

In some embodiments, after forming the second material layer, the method further comprises: forming at least one edge trench on the substrate through the at least one through hole and forming a plurality of central trenches on the substrate through the plurality of central grooves, wherein a width of the at least one edge trench is greater than a width of the plurality of central trenches.

In some embodiments, a depth of the at least one edge trench is substantially equal to a depth of the plurality of central trenches.

In some embodiments, after forming the at least one edge trench and the plurality of central trenches, the method further comprises: forming the at least one edge word line in the at least one edge trench and forming the plurality of central word lines in the plurality of central trenches.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
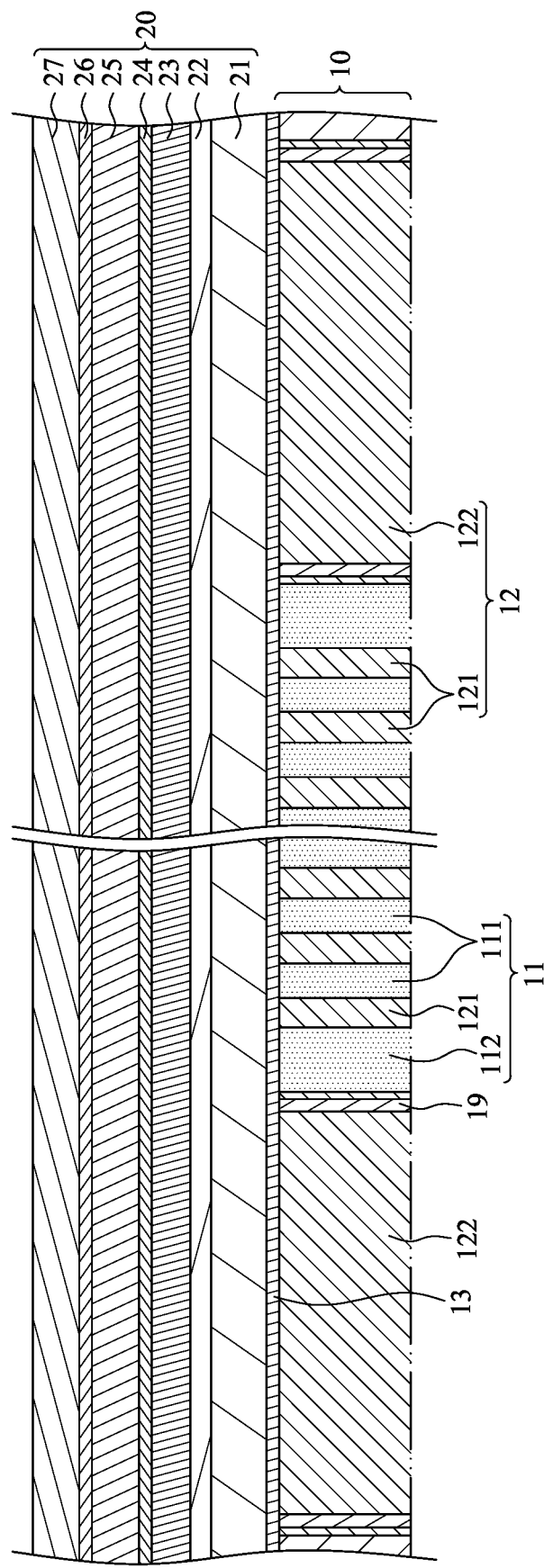
FIG. 1 illustrates a cross-sectional view of one or more stages of an example of a method of manufacturing a semiconductor structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 through FIG. 21 illustrate a method of manufacturing a semiconductor structure 1 according to some embodiments of the present disclosure. Referring to FIG. 1, a substrate 10 and a sacrificial structure 20 are provided. FIG. 1 illustrates a cross-sectional view of the sacrificial structure 20 on the substrate 10 according to some embodiments of the present disclosure. In some embodiments, the substrate 10 may include, for example, silicon (Si), germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

In some embodiments, as shown in FIG. 1, the substrate 10 may include a plurality of semiconductor portions 11, a plurality of isolation portions 12, a cover layer 13 and at least one liner portion 19. The plurality of semiconductor portions 11 may be spaced apart from each other and arranged in an array. In some embodiments, the plurality of semiconductor portions 11 may include a plurality of central semiconductor portions 111 and at least one edge semiconductor portion 112. The plurality of central semiconductor portions 111 may be spaced apart from each other. In some embodiments, a width of the at least one edge semiconductor portion 112 may be greater than a width of the plurality of central semiconductor portions 111.

The plurality of isolation portions 12 may also be referred to as "shallow trench isolations." The plurality of isolation portions 12 may be disposed between the plurality of semiconductor portions 11. In some embodiments, the plurality of isolation portions 12 may include, for example, oxide, and may be embedded in the substrate 10. In some embodiments, the plurality of isolation portions 12 may include a plurality of first isolation portions 121 and a plurality of second isolation portions 122. Each of the plurality of first isolation portions 121 may be disposed between two adjacent central semiconductor portions 111 or between the at least one edge semiconductor portion 112 and one of the plurality of central semiconductor portions 111. The plurality of second isolation portions 122 may be around the at least one edge semiconductor portion 112. In some embodiments, a width of the plurality of second isolation portions 122 may be greater than a width of the plurality of first isolation portions 121.

In some embodiments, the edge semiconductor portion 112 may be in a ring shape from a top view, and may surround the plurality of central semiconductor portions 111. That is, the edge semiconductor portion 112 may be the outermost portion of the semiconductor portions 11 in a region defined by two second isolation portions 122. The edge semiconductor portion 112 may be disposed between the outermost first isolation portions 121 and the second isolation portion 122.

The cover layer 13 may also be referred to as "sixth sacrificial layer." The cover layer 13 may be disposed over the plurality of semiconductor portions 11 and the plurality of isolation portions 12. In some embodiments, the cover layer 13 may include, for example, nitride.

The at least one liner portion 19 may extend into the plurality of second isolation portions 122. In some embodiments, the at least one liner portion 19 may contact the cover layer 13. In some embodiments, the liner portion 19 may include, for example, nitride.

The sacrificial structure 20 may be disposed on or disposed over the substrate 10. In some embodiments, as shown in FIG. 1, the sacrificial structure 20 may include a plurality of sacrificial layers (including, for example, a first sacrificial layer 21, a second sacrificial layer 22, a third sacrificial layer 23, a fourth sacrificial layer 24, a fifth sacrificial layer 25, a sixth sacrificial layer 26 and a seventh sacrificial layer 27). The plurality of sacrificial layers (e.g., the first sacrificial layer 21, the second sacrificial layer 22, the third sacrificial layer 23, the fourth sacrificial layer 24, the fifth sacrificial layer 25, the sixth sacrificial layer 26 and the seventh sacrificial layer 27) may be stacked on one another.

As shown in FIG. 1, the first sacrificial layer 21 may be formed on the substrate 10 (e.g., the cover layer 13). In some embodiments, the first sacrificial layer 21 may be, for example, carbon layer. The second sacrificial layer 22 may be formed on the first sacrificial layer 21. In some embodiments, the second sacrificial layer 22 may be, for example, antireflective coating layer. The third sacrificial layer 23 may be formed on the second sacrificial layer 22. In some embodiments, the third sacrificial layer 23 may be, for example, carbon layer. The fourth sacrificial layer 24 may be formed on the third sacrificial layer 23. In some embodiments, the fourth sacrificial layer 24 may be, for example, antireflective coating layer. The fifth sacrificial layer 25 may be formed on the fourth sacrificial layer 24. In some embodiments, the fifth sacrificial layer 25 may be, for example, carbon layer. The sixth sacrificial layer 26 may be formed on the fifth sacrificial layer 25. In some embodiments, the sixth sacrificial layer 26 may be, for example, hard mask layer. The seventh sacrificial layer 27 may be formed on the sixth sacrificial layer 26. In some embodiments, the seventh sacrificial layer 27 may be, for example, photoresist layer.

Figure 2:
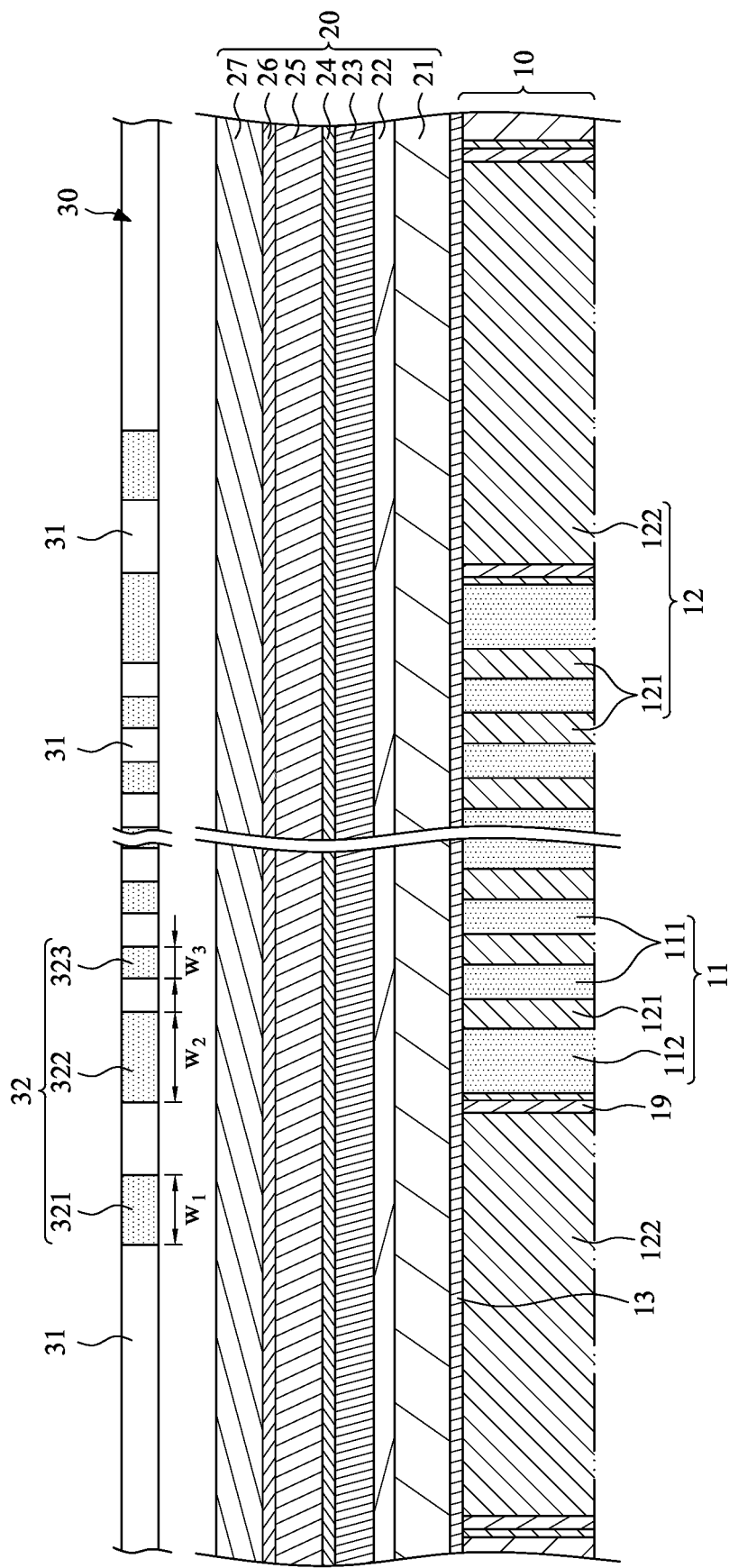
FIG. 2 illustrates a cross-sectional view of one or more stages of an example of a method of manufacturing a semiconductor structure according to some embodiments of the present disclosure.
Figure 3:
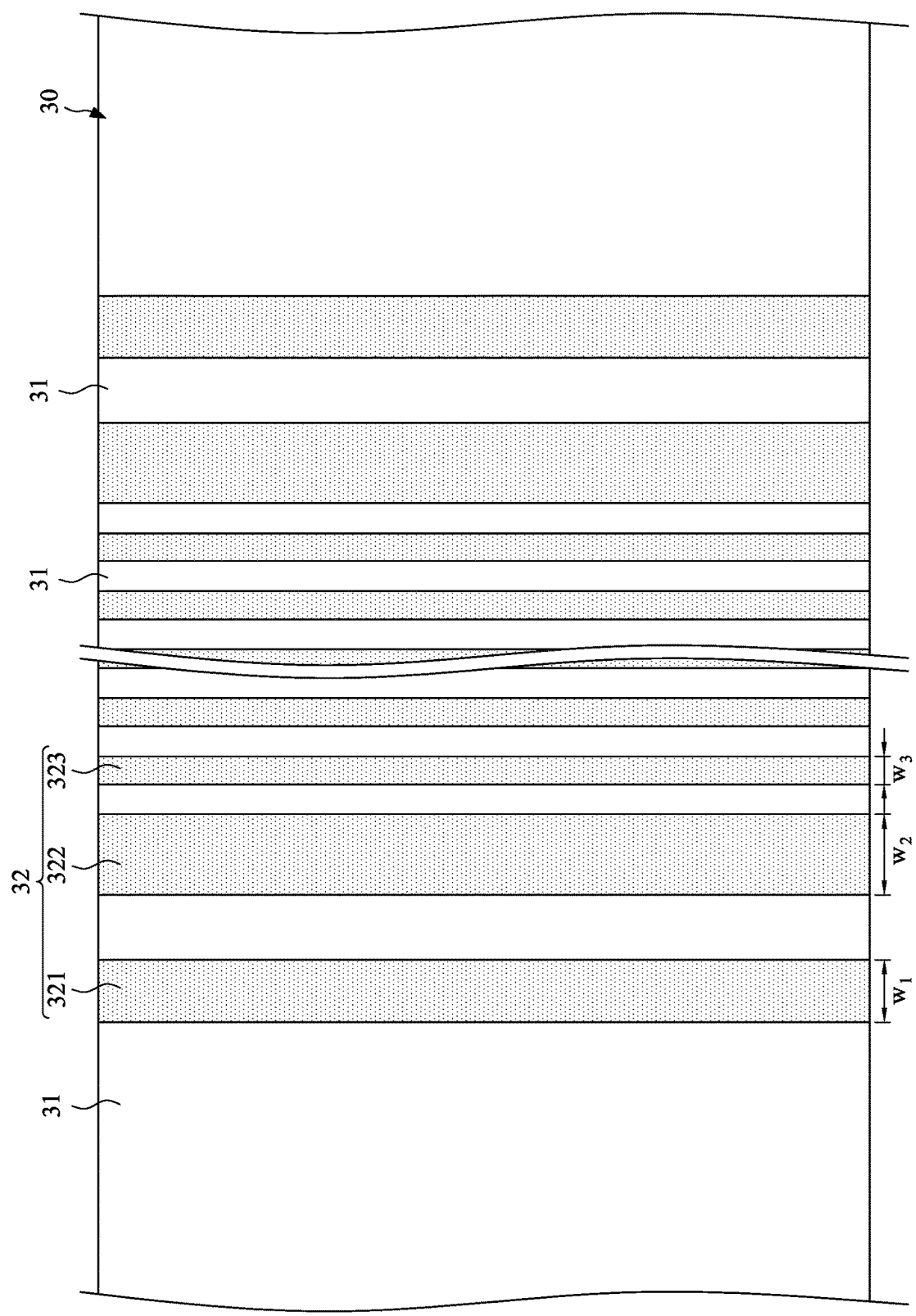
FIG. 3 illustrates a top view of one or more stages of an example of a method of manufacturing a semiconductor structure according to some embodiments of the present disclosure.

Referring to FIG. 2 and FIG. 3, a photomask 30 is arranged to cover the sacrificial structure 20. FIG. 2 illustrates a cross-sectional view of the photomask 30 arranged to cover the sacrificial structure 20 according to some embodiments of the present disclosure. FIG. 3 illustrates a top view of the photomask 30 according to some embodiments of the present disclosure. In some embodiments, the photomask 30 may include a plurality of transparent portions 31 and a plurality of opaque portions 32. The plurality of transparent portions 31 may be spaced apart from each other through the plurality of opaque portions 32. The plurality of opaque portions 32 may be disposed between the plurality of transparent portions 31.

In some embodiments, the plurality of opaque portions 32 may include a plurality of central opaque portions 323, at least one first edge opaque portion 321 and at least one second edge opaque portion 322. The plurality of central opaque portions 323 may be spaced apart from each other. The at least one second edge opaque portion 322 may be between the at least one first edge opaque portion 321 and the plurality of central opaque portions 323. The first edge opaque portion 321 may be the outermost opaque portion. In some embodiments, a width $w_2$ of the second edge opaque portion 322 may be greater than a width $w_1$ of the first edge opaque portion 321 and a width $w_3$ of the central opaque portion 323. The width $w_1$ of the first edge opaque portion 321 may be greater than the width $w_3$ of the central opaque portion 323.

Figure 4:
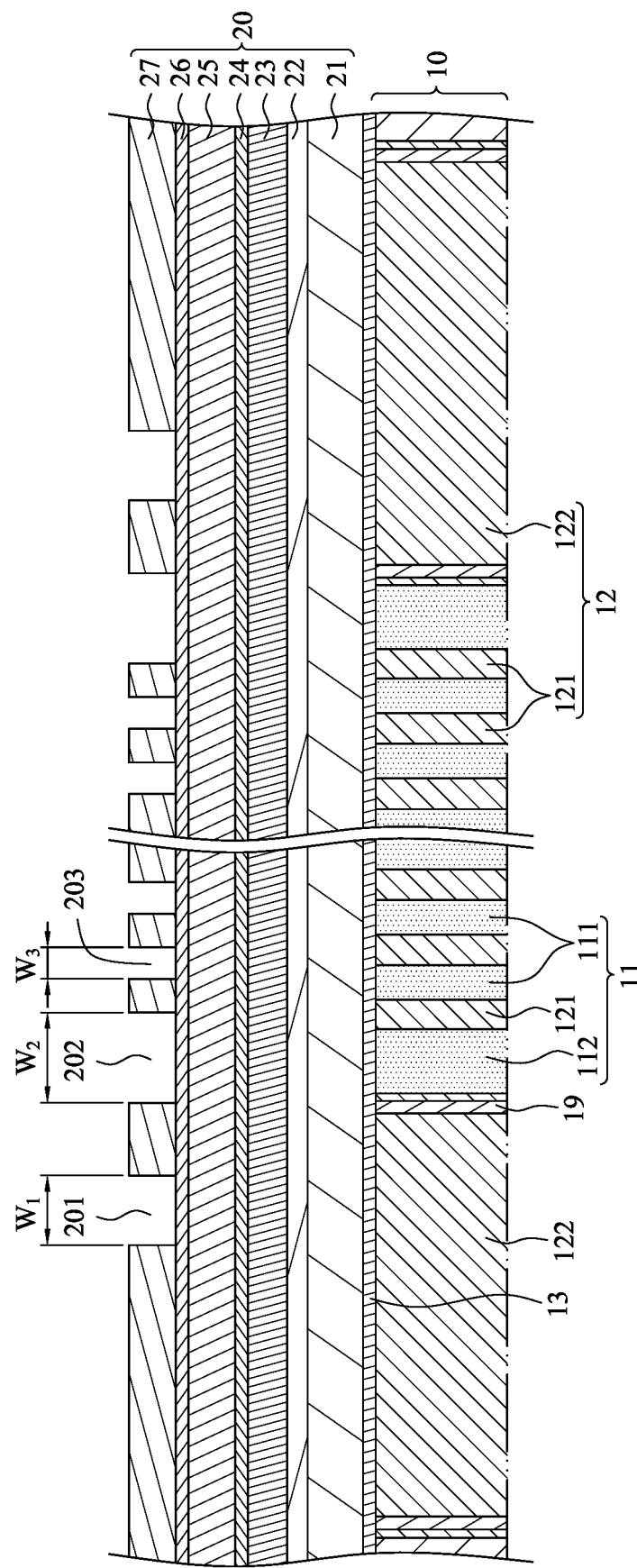
FIG. 4 illustrates a cross-sectional view of one or more stages of an example of a method of manufacturing a semiconductor structure according to some embodiments of the present disclosure.

Referring to FIG. 4 through FIG. 14, portions of the sacrificial structure 20 are removed. Referring to FIG. 4, portions of the seventh sacrificial layer 27 (e.g., the photoresist layer) are removed to form a plurality of central openings 203, at least one first edge opening 201 and at least one second edge opening 202 through the plurality of central opaque portions 323, the at least one first edge opaque portion 321, the at least one second edge opaque portion 322 and the plurality of transparent portions 31 of the photomask 30, respectively, by, for example, photolithographic technique (including exposing and developing). The plurality of central openings 203, the at least one first edge opening 201 and the at least one second edge opening 202 extend through the seventh sacrificial layer 27 and expose portions (e.g., portions of a top surface) of the sixth sacrificial layer 26. In some embodiments, a width $W_2$ of the second edge opening 202 may be greater than a width $W_1$ of the first edge opening 201 and a width $W_3$ of the central opening 203. The width $W_1$ of the first edge opening 201 may be greater than the width $W_3$ of the central opening 203. The width $W_1$ of the first edge opening 201 may be equal to the width $w_1$ of the first edge opaque portion 321 of the photomask 30. The width $W_2$ of the second edge opening 202 may be equal to the width $w_2$ of the second edge opaque portion 322 of the photomask 30. The width $W_3$ of the central opening 203 may be equal to the width $w_3$ of the central opaque portion 323.

Figure 5:
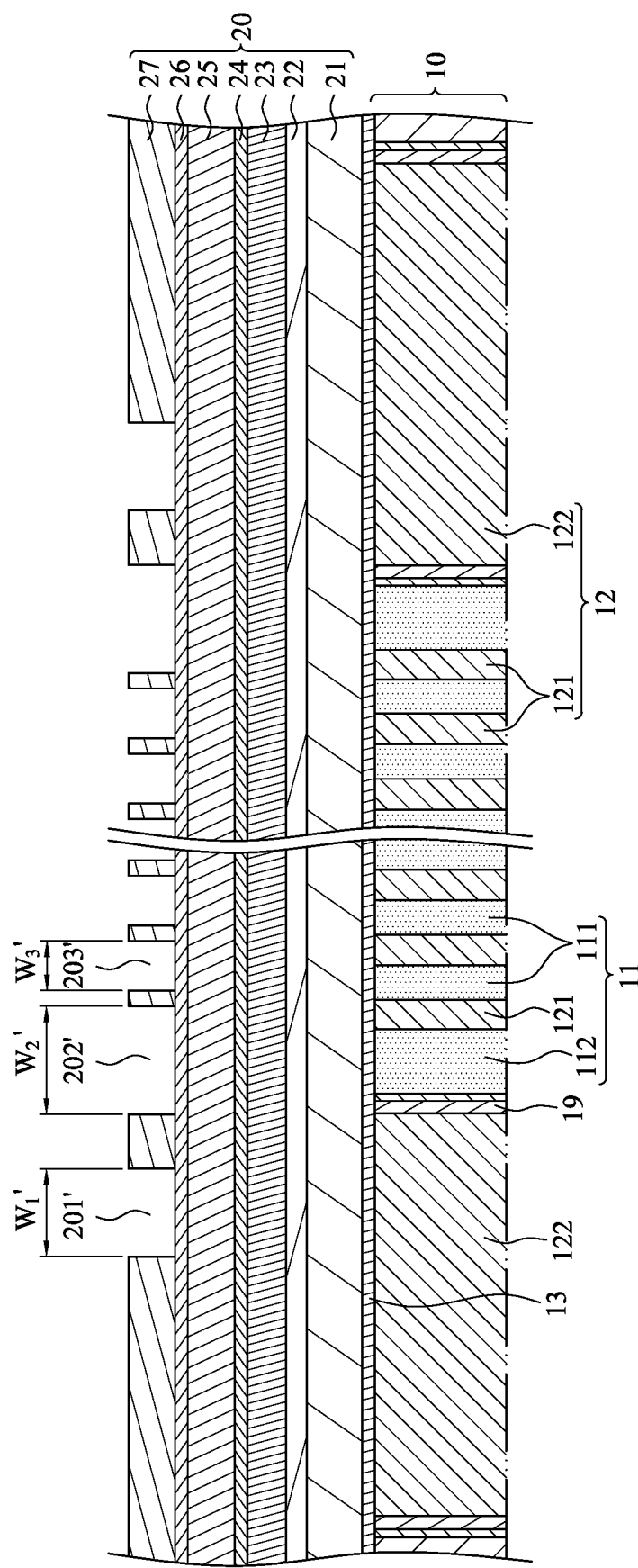
FIG. 5 illustrates a cross-sectional view of one or more stages of an example of a method of manufacturing a semiconductor structure according to some embodiments of the present disclosure.

Referring to FIG. 4 and FIG. 5, the plurality of central openings 203, the at least one first edge opening 201 and the at least one second edge opening 202 are trimmed to enlarge by, for example, etching. That is, a width $W_1'$ of the trimmed first edge opening 201' is greater than the width $W_1$ of the first edge opening 201 of FIG. 4, a width $W_2'$ of the trimmed second edge opening 202' is greater than the width $W_2$ of the second edge opening 202 of FIG. 4, and a width $W_3'$ of the trimmed central openings 203' is greater than the width $W_3$ of the central openings 203 of FIG. 4.

Figure 6:
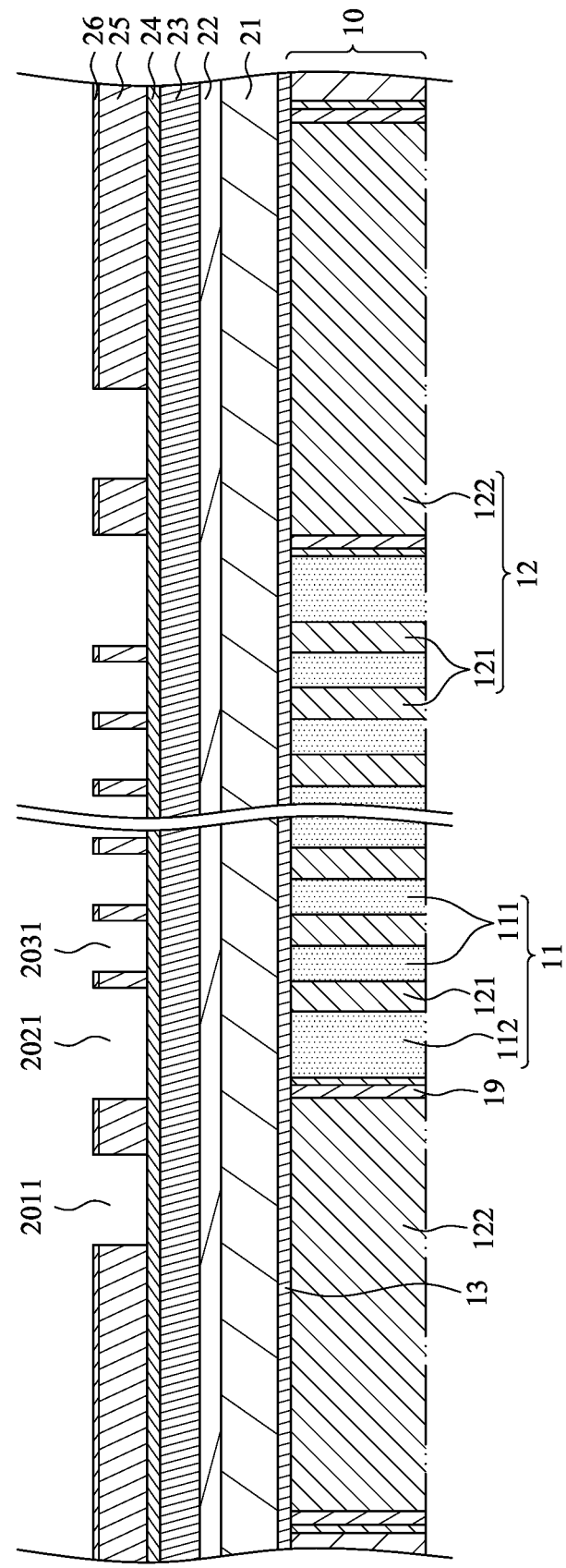
FIG. 6 illustrates a cross-sectional view of one or more stages of an example of a method of manufacturing a semiconductor structure according to some embodiments of the present disclosure.

Referring to FIG. 5 and FIG. 6, portions of the sixth sacrificial layer 26 and portions of the fifth sacrificial layer 25 are removed to form a plurality of first central openings 2031, at least one third edge opening 2011 and at least one fourth edge opening 2021 through the trimmed central openings 203', the trimmed first edge opening 201' and the trimmed second edge opening 202', respectively, by, for example, dry etching. In some embodiments, the plurality of first central openings 2031 may be formed through the trimmed central openings 203'. The at least one third edge opening 2011 may be formed through the trimmed first edge opening 201'. The at least one fourth edge opening 2021 may be formed through the trimmed second edge opening 202'. The plurality of first central openings 2031, the at least one third edge opening 2011 and the at least one fourth edge opening 2021 extend through the sixth sacrificial layer 26 and the fifth sacrificial layer 25 and expose portions (e.g., portions of a top surface) of the fourth sacrificial layer 24.

Figure 7:
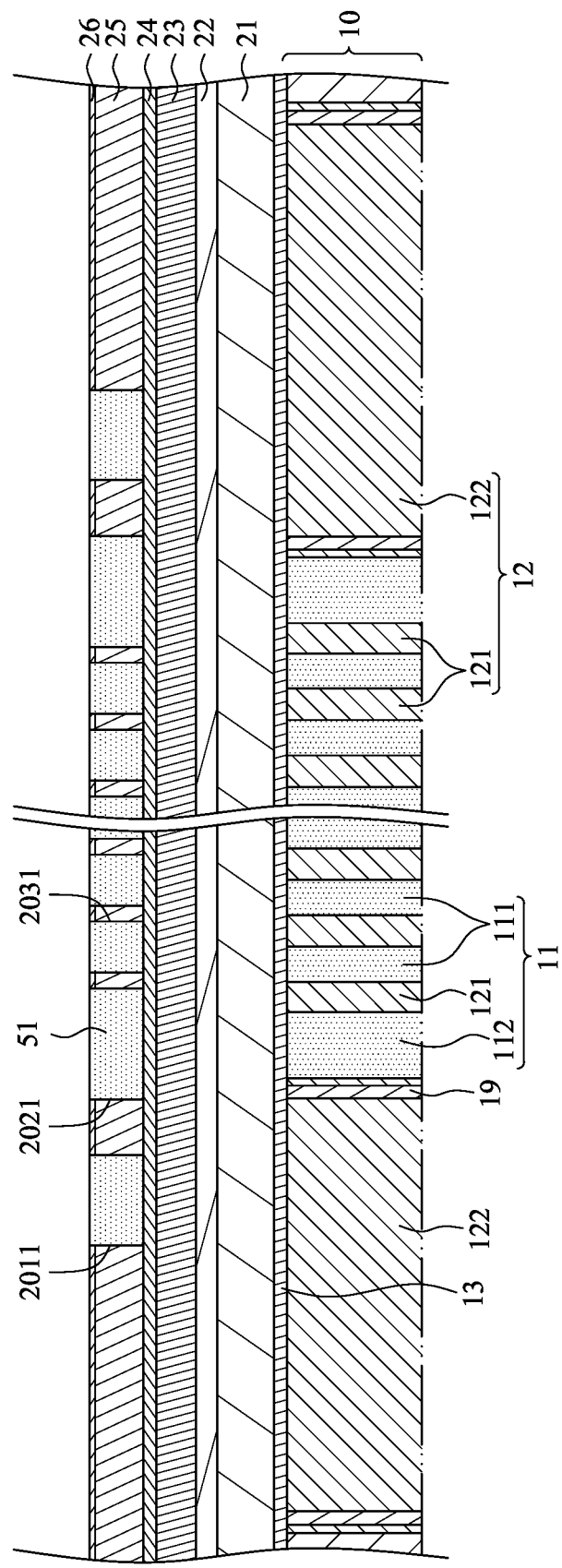
FIG. 7 illustrates a cross-sectional view of one or more stages of an example of a method of manufacturing a semiconductor structure according to some embodiments of the present disclosure.

Referring to FIG. 7, a first material layer 51 is formed to fill the plurality of first central openings 2031, the at least one third edge opening 2011 and the at least one fourth edge opening 2021 by, for example, coating or deposition. In some embodiments, the first material layer 51 may be, for example, oxide layer.

Figure 8:
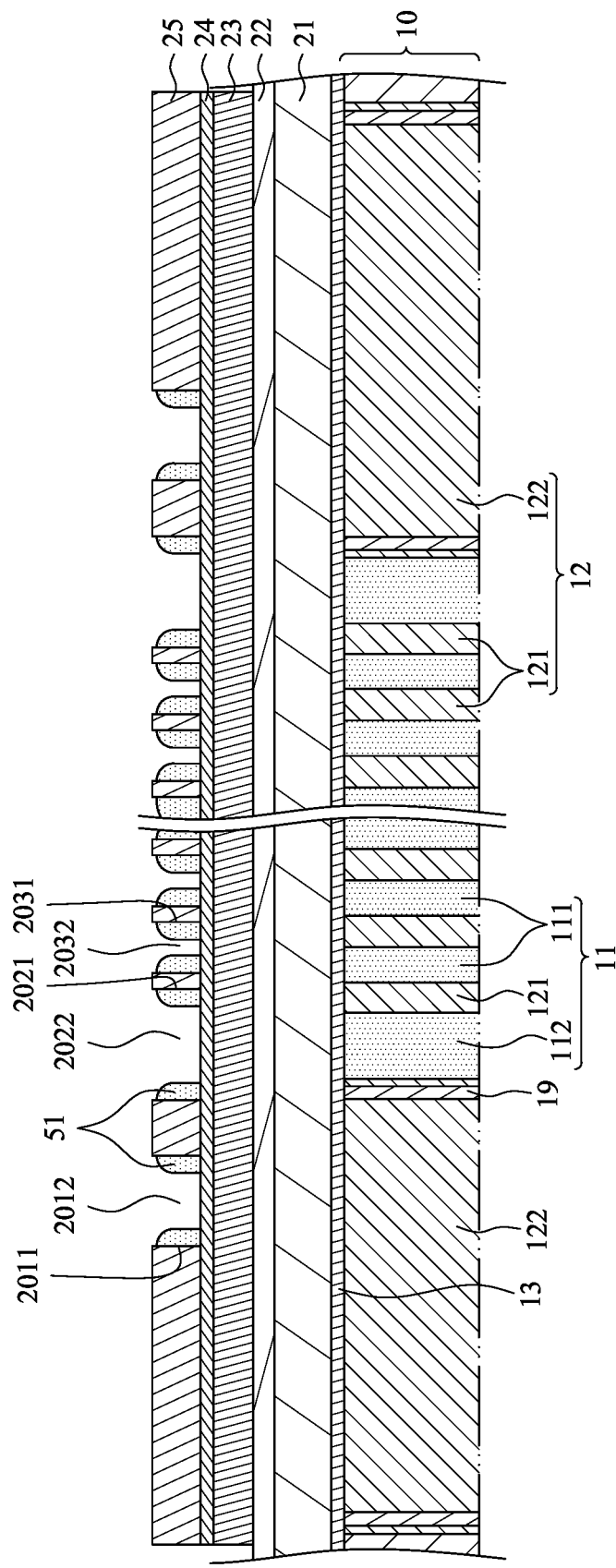
FIG. 8 illustrates a cross-sectional view of one or more stages of an example of a method of manufacturing a semiconductor structure according to some embodiments of the present disclosure.

Referring to FIG. 8, the sixth sacrificial layer 26 and portions of the first material layer 51 are removed to form a plurality of second central openings 2032, at least one fifth edge opening 2012 and at least one sixth edge opening 2022 by, for example, dry etching. As shown in FIG. 8, each of the plurality of second central openings 2032 may be formed in each of the plurality of first central openings 2031. The second central openings 2032 may be defined by the portions of the first material layer 51 remained in the first central opening 2031. The at least one fifth edge opening 2012 may be formed in the at least one third edge opening 2011. The at least one fifth edge opening 2012 may be defined by the portions of the first material layer 51 remained in the third edge opening 2011. The at least one sixth edge opening 2022 may be formed in the at least one fourth edge opening 2021. The at least one sixth edge opening 2022 may be defined by the portions of the first material layer 51 remained in the fourth edge opening 2021. Thus, the plurality of first central openings 2031 may be narrowed to the plurality of second central openings 2032, the at least one third edge opening 2011 may be narrowed to the at least one fifth edge opening 2012 and the at least one fourth edge opening 2021 may be narrowed to the at least one sixth edge opening 2022 through the first material layer 51.

Figure 9:
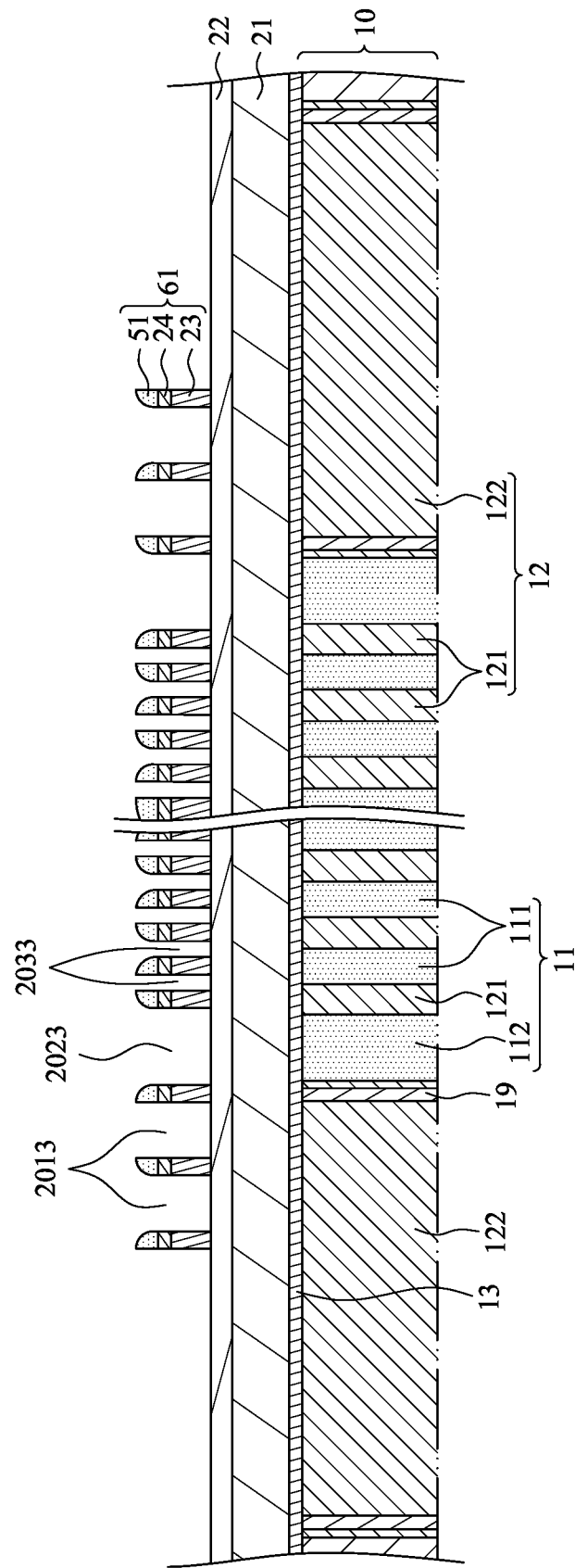
FIG. 9 illustrates a cross-sectional view of one or more stages of an example of a method of manufacturing a semiconductor structure according to some embodiments of the present disclosure.

Referring to FIG. 8 and FIG. 9, the fifth sacrificial layer 25, portions of the fourth sacrificial layer 24 and portions of the third sacrificial layer 23 are removed to form a plurality of third central openings 2033, at least two seventh edge openings 2013, at least one eighth edge opening 2023 and a plurality of first pillars 61 by, for example, dry etching. The plurality of third central openings 2033, the at least two seventh edge openings 2013 and the at least one eighth edge opening 2023 extend through the fourth sacrificial layer 24 and the third sacrificial layer 23 and expose portions (e.g., portions of a top surface) of the second sacrificial layer 22. The at least one eighth edge opening 2023 may be between the at least two seventh edge openings 2013 and the plurality of third central openings 2033. The plurality of first pillars 61 may be spaced apart from each other to define the at least two seventh edge openings 2013, the at least one eighth edge opening 2023 and the plurality of third central openings 2033. In some embodiments, each of the plurality of first pillars 61 may include a portion of the first material layer 51, a portion of the fourth sacrificial layer 24 and a portion of the third sacrificial layer 23. In some embodiments, a width of the eighth edge opening 2023 may be greater than a width of the seventh edge opening 2013 and a width of the third central opening 2033.

Figure 10:
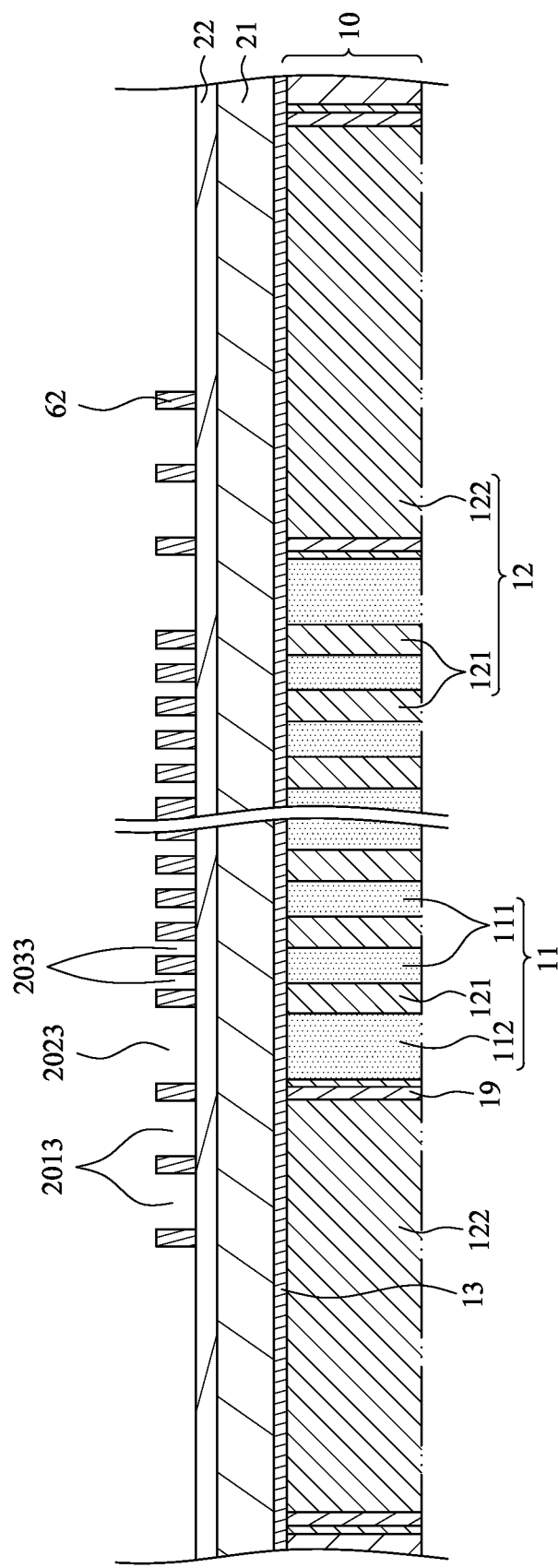
FIG. 10 illustrates a cross-sectional view of one or more stages of an example of a method of manufacturing a semiconductor structure according to some embodiments of the present disclosure.

Referring to FIG. 9 and FIG. 10, the first material layer 51 and the fourth sacrificial layer 24 are removed to form a plurality of second pillars 62 by, for example, wet etching. The plurality of second pillars 62 may be portions of the third sacrificial layer 23. A height of the plurality of second pillars 62 of FIG. 10 may be less than a height of the plurality of first pillars 61 of FIG. 9.

Figure 11:
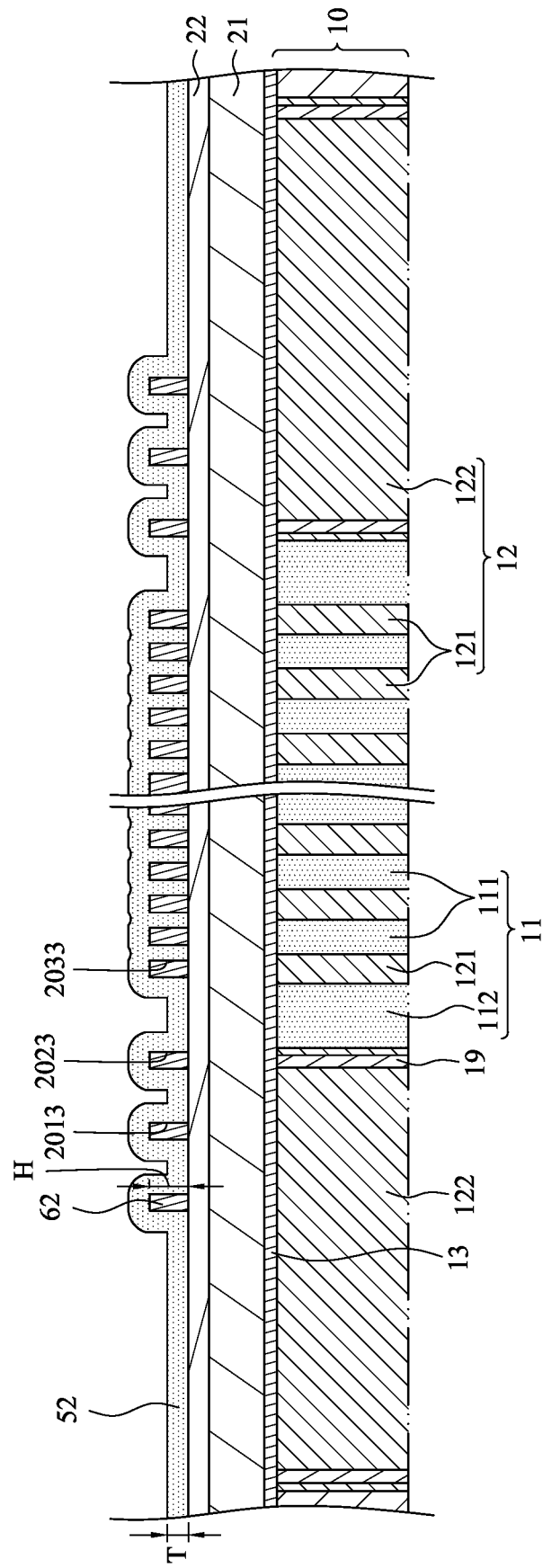
FIG. 11 illustrates a cross-sectional view of one or more stages of an example of a method of manufacturing a semiconductor structure according to some embodiments of the present disclosure.

Referring to FIG. 11, a second material layer 52 is formed on the second sacrificial layer 22 to cover the plurality of second pillars 62, the plurality of third central openings 2033, portions of the at least two seventh edge openings 2013 and a portion of the at least one eighth edge opening 2023 by, for example, coating or deposition. The second material layer 52 may be, for example, oxide layer. In some embodiments, a thickness T of the second material layer 52 may be less than a height H of the plurality of second pillars 62 and a depth d of the at least one eighth edge opening 2023. In some embodiments, the second material layer 52 may not fill the seventh edge openings 2013 and the eighth edge opening 2023. The second material layer 52 may fill the eighth edge opening 2023.

Figure 12:
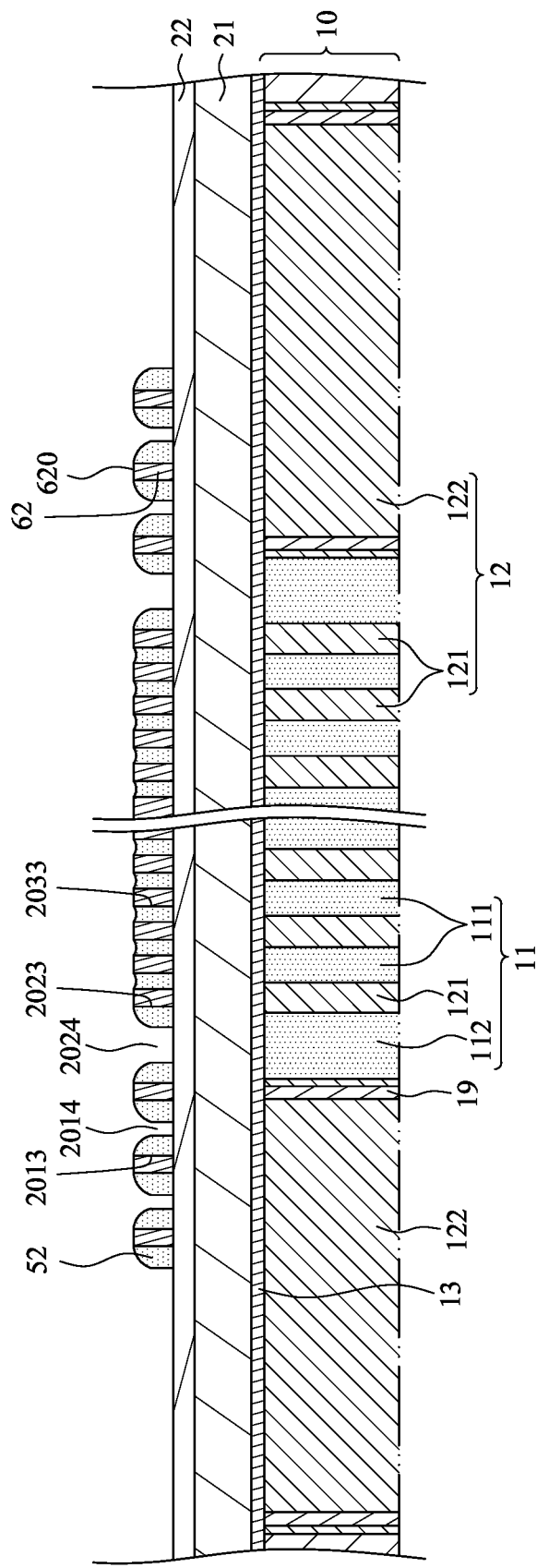
FIG. 12 illustrates a cross-sectional view of one or more stages of an example of a method of manufacturing a semiconductor structure according to some embodiments of the present disclosure.

Referring to FIG. 12, portions of the second material layer 52 are removed to expose top surfaces 620 of the plurality of second pillars 62 and the top surface of the second sacrificial layer 22, so as to form at least one through hole 2024 in the at least one eighth edge opening 2023 and at least one ninth edge opening 2014 in the seventh edge openings 2013 by, for example, dry etching. The through hole 2024 may be defined by the portions of the second material layer 52 remained in the eighth edge opening 2023. The ninth edge opening 2014 may be defined by the portions of the second material layer 52 remained in the seventh edge openings 2013. In some embodiments, a width of the at least one through hole 2024 may be greater than a width of the at least one ninth edge opening 2014.

Figure 13:
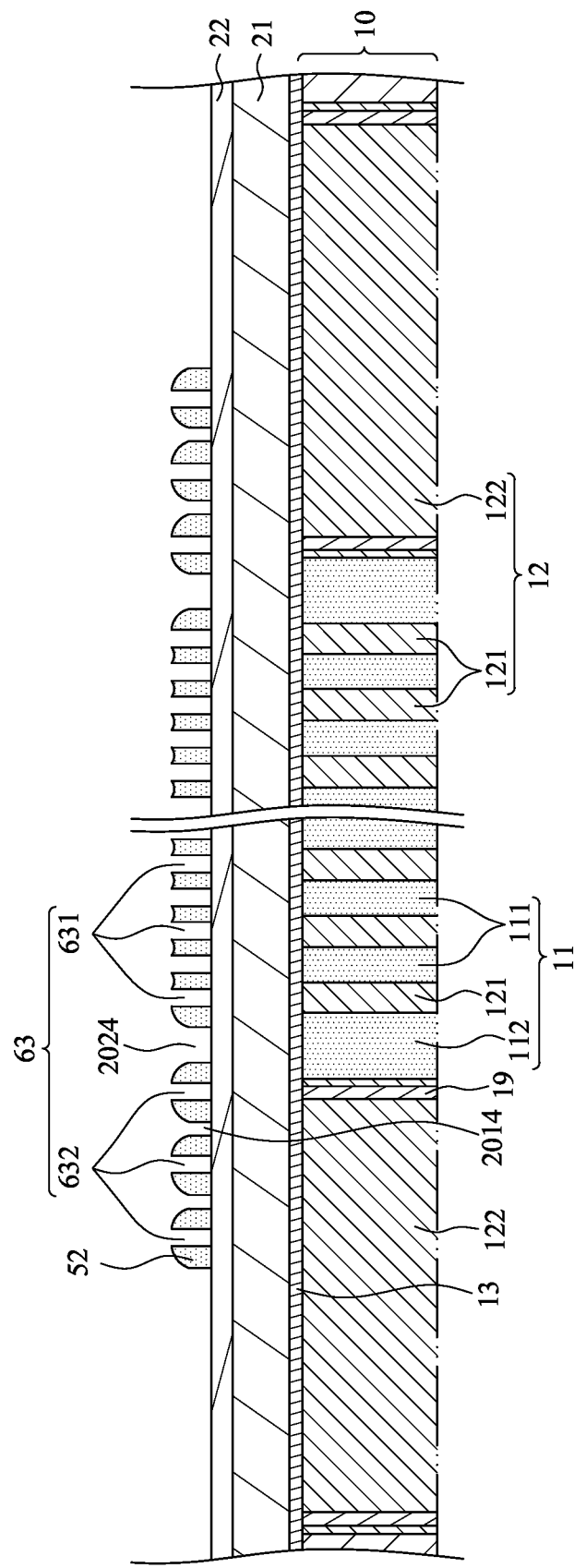
FIG. 13 illustrates a cross-sectional view of one or more stages of an example of a method of manufacturing a semiconductor structure according to some embodiments of the present disclosure.

Referring to FIG. 12 and FIG. 13, the plurality of second pillars 62 are removed to form a plurality of grooves 63 by, for example, dry etching. In some embodiments, the plurality of grooves 63 may include a plurality of central grooves 631 and a plurality of edge grooves 632. The at least one through hole 2024 may be between the plurality of central grooves 631 and the plurality of edge grooves 632. The at least one ninth edge opening 2014 may be between the plurality of edge grooves 632. In some embodiments, the width of the at least one through hole 2024 may be greater than a width of the plurality of grooves 63 (including, for example, the plurality of central grooves 631 and the plurality of edge grooves 632).

Figure 14:
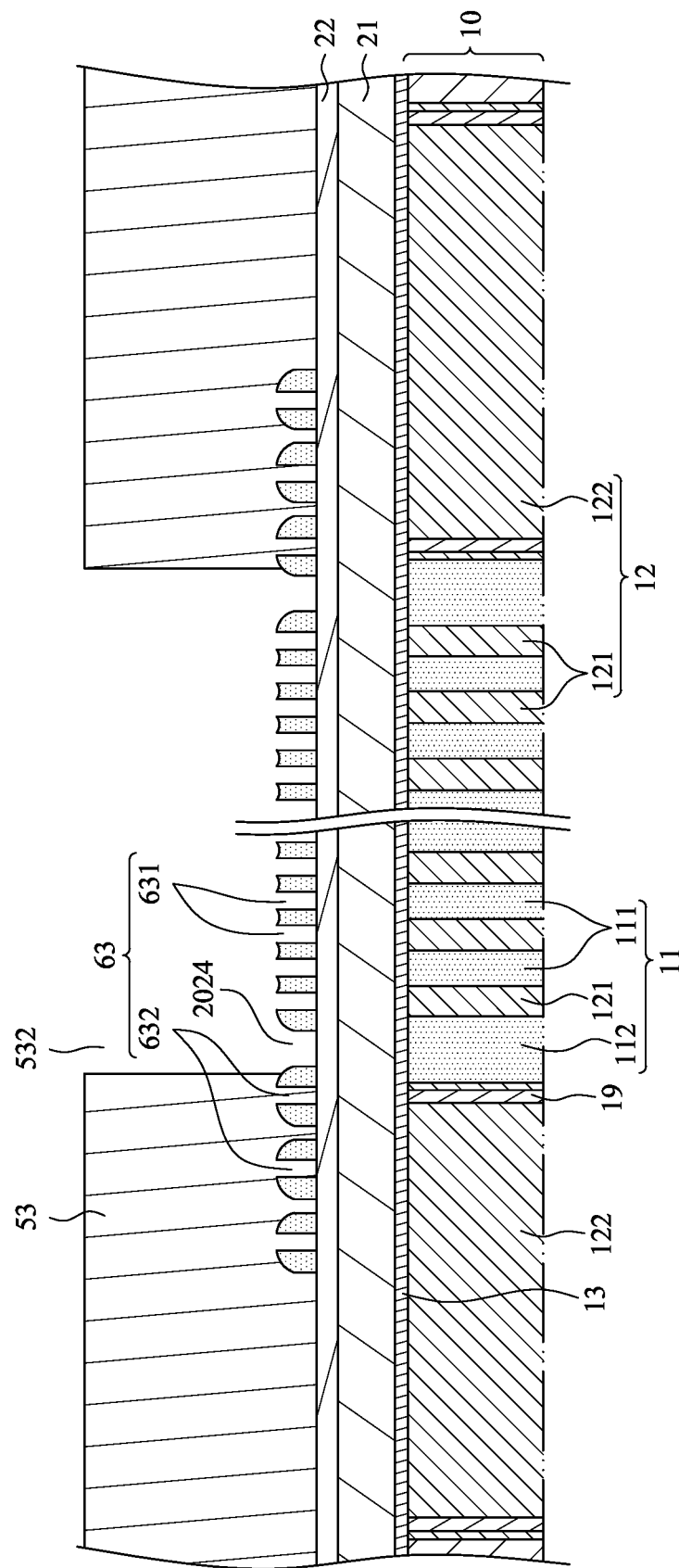
FIG. 14 illustrates a cross-sectional view of one or more stages of an example of a method of manufacturing a semiconductor structure according to some embodiments of the present disclosure.

Referring to FIG. 14, a third material layer 53 is formed on the second sacrificial layer 22 to cover the plurality of edge grooves 632 by, for example, photolithographic technique (including exposing and developing). In some embodiments, the third material layer 53 may be, for example, photoresist layer. As shown in FIG. 14, the third material layer 53 extends into the plurality of edge grooves 632. Thus, the third material layer 53 can be firmly fixed on the second sacrificial layer 22. The third material layer 53 may define an opening 532 to expose the at least one through hole 2024 and the plurality of central grooves 631. That is, the third material layer 53 may not cover the through hole 2024 and the central grooves 631.

Figure 15:
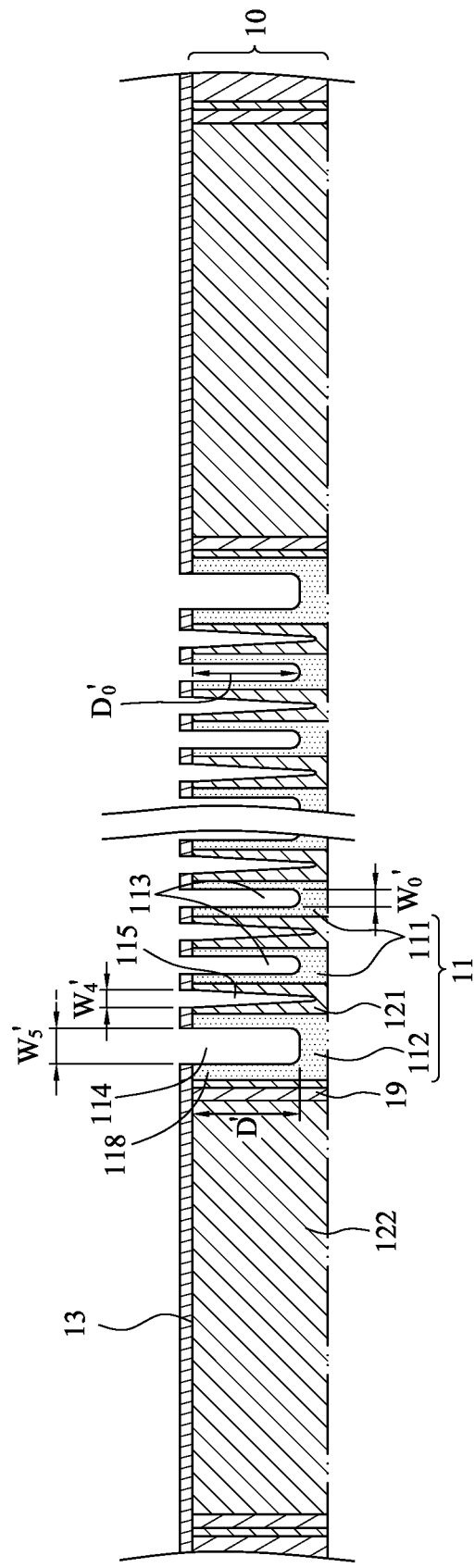
FIG. 15 illustrates a cross-sectional view of one or more stages of an example of a method of manufacturing a semiconductor structure according to some embodiments of the present disclosure.

Referring to FIG. 14 and FIG. 15, at least one edge trench 114 is formed on the at least one edge semiconductor portion 112 of the substrate 10 through the at least one through hole 2024, a plurality of central trenches 113 are formed on the plurality of central semiconductor portions 111 of the substrate 10 through a first portion of the plurality of central grooves 631, and a plurality of intermediate trenches 115 are formed on the plurality of first isolation portions 121 of the substrate 10 through a second portion of the plurality of central grooves 631 by, for example, etching. Then, the third material layer 53, the second material layer 52, the second sacrificial layer 22 and the first sacrificial layer 21 are removed. As shown in FIG. 15, at least one active area moat 118 may be formed between the at least one edge trench 114 and the second isolation portion 122. The at least one edge trench 114 extends through the cover layer 13 and extends into a portion of the at least one edge semiconductor portion 112. Each of the plurality of central trenches 113 extends through the cover layer 13 and extends into a portion of each of the plurality of central semiconductor portions 111. Each of the plurality of intermediate trenches 115 extends through the cover layer 13 and extends into a portion of each of the plurality of first isolation portions 121. In some embodiments, a width $W_5'$ of the edge trench 114 may be greater than a width $W_0'$ of the central trench 113 and a width $W_4'$ of the intermediate trench 115. A depth D' of the edge trench 114 may be substantially equal to a depth $D_0'$ of the central trench 113. A depth of the intermediate trench 115 may be greater than the depth D' of the edge trench 114 and the depth $D_0'$ of the central trench 113.

Figure 16:
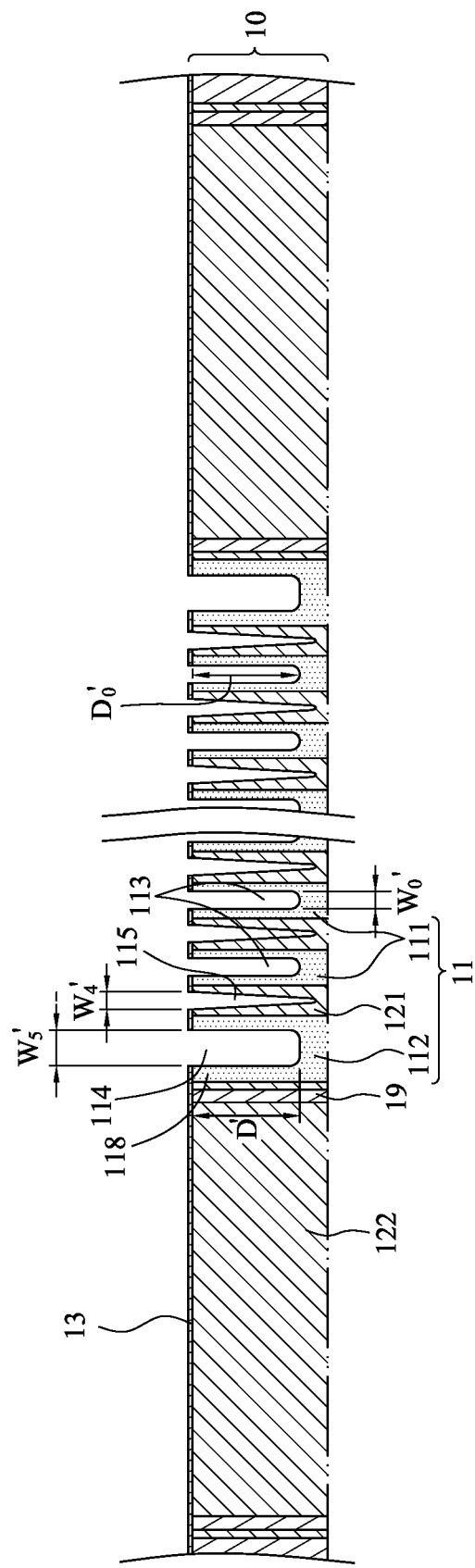
FIG. 16 illustrates a cross-sectional view of one or more stages of an example of a method of manufacturing a semiconductor structure according to some embodiments of the present disclosure.

Referring to FIG. 16, the cover layer 13 is thinned by, for example, dry etching.

Figure 17:
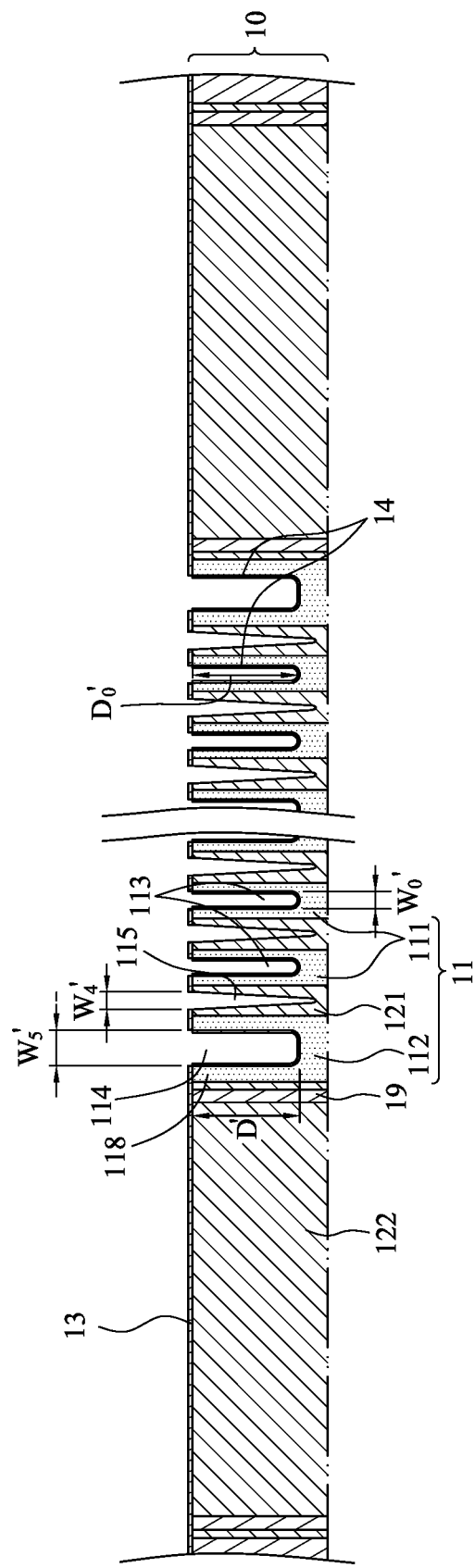
FIG. 17 illustrates a cross-sectional view of one or more stages of an example of a method of manufacturing a semiconductor structure according to some embodiments of the present disclosure.

Referring to FIG. 17 through FIG. 21, at least one edge word line 102, a plurality of central word lines 103 and a plurality of intermediate word line 104 are formed on the substrate 10 to obtain the semiconductor structure 1. Referring to FIG. 17, an isolation layer 14 is formed in the at least one edge trench 114 and the plurality of central trenches 113 by, for example, deposition. In some embodiments, the isolation layer 14 may also be referred to as "gate oxide layer." The isolation layer 14 may include, for example, silicon oxynitride (SiON), silicon oxide or a high-K dielectric material. As shown in FIG. 17, the isolation layer 14 covers a sidewall of the at least one edge trench 114 and sidewalls of the plurality of central trenches 113.

Figure 18:
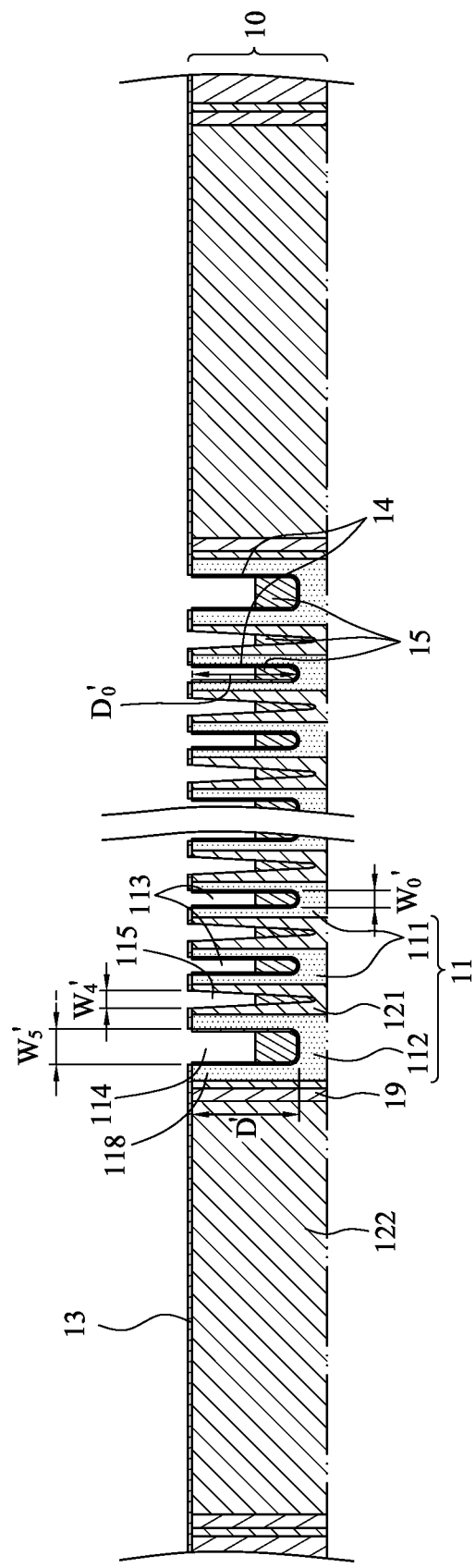
FIG. 18 illustrates a cross-sectional view of one or more stages of an example of a method of manufacturing a semiconductor structure according to some embodiments of the present disclosure.

Referring to FIG. 18, a conductive material 15 is formed in the plurality of central trenches 113, the at least one edge trench 114 and the plurality of intermediate trenches 115 to cover a portion of the isolation layer 14 by, for example, deposition. In some embodiments, the conductive material 15 may be, for example, metal material. The metal material may include, for example, tungsten. In some embodiments, as shown in FIG. 18, a thickness of the conductive material 15 in the at least one edge trench 114 may be the same as a thickness of the conductive material 15 in the plurality of central trenches 113. An elevation of the conductive material 15 in the at least one edge trench 114 may be same as an elevation of the conductive material 15 in the plurality of central trenches 113 and an elevation of the conductive material 15 in the plurality of intermediate trenches 115.

Figure 19:
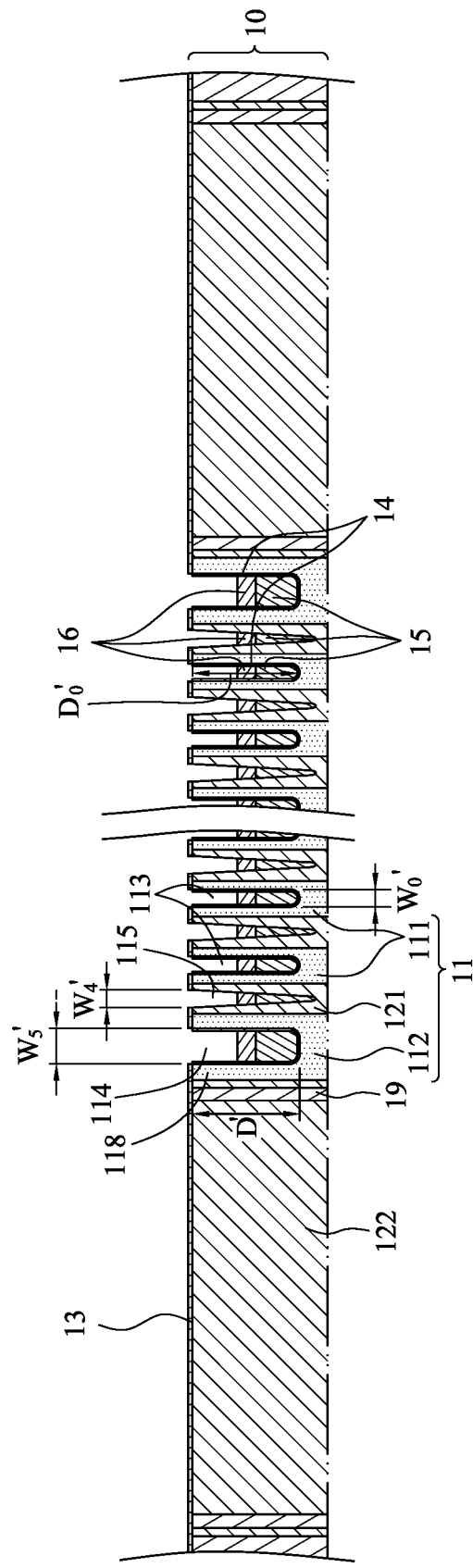
FIG. 19 illustrates a cross-sectional view of one or more stages of an example of a method of manufacturing a semiconductor structure according to some embodiments of the present disclosure.

Referring to FIG. 19, a polysilicon layer 16 is formed in the plurality of central trenches 113, the at least one edge trench 114 and the plurality of intermediate trenches 115 and on the conductive material 15 by, for example, deposition. In some embodiments, as shown in FIG. 19, a thickness of the polysilicon layer 16 in the at least one edge trench 114 may be the same as a thickness of the polysilicon layer 16 in the plurality of central trenches 113 and a thickness of the polysilicon layer 16 in the plurality of intermediate trenches 115. An elevation of the polysilicon layer 16 in the at least one edge trench 114 may be same as an elevation of the polysilicon layer 16 in the plurality of central trenches 113 and an elevation of the polysilicon layer 16 in the plurality of intermediate trenches 115. In some embodiments, the thickness of the polysilicon layer 16 may be less than the thickness of the conductive material 15.

Figure 20:
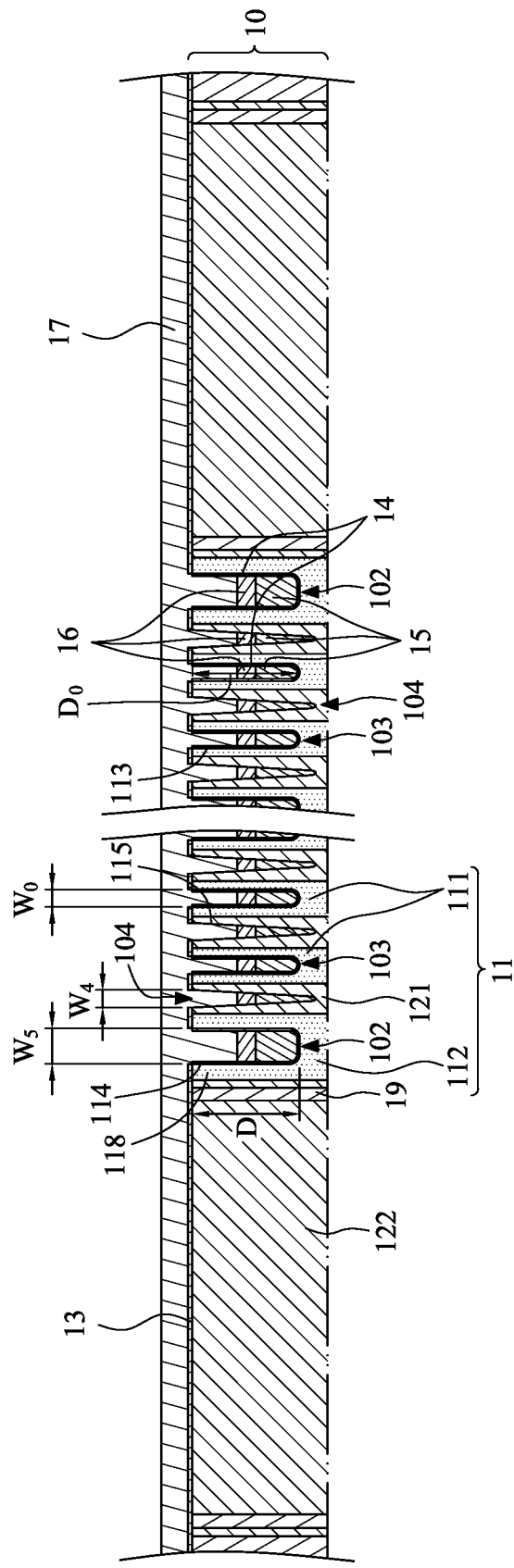
FIG. 20 illustrates a cross-sectional view of one or more stages of an example of a method of manufacturing a semiconductor structure according to some embodiments of the present disclosure.

Referring to FIG. 20, a nitride layer 17 is formed on the cover layer 13, in the plurality of central trenches 113, the at least one edge trench 114 and the plurality of intermediate trenches 115, and on the polysilicon layer 16 by, for example, deposition. Meanwhile, the at least one edge word line 102, the plurality of central word lines 103 and the plurality of intermediate word lines 104 are formed. The at least one edge word line 102 extends into the at least one edge semiconductor portion 112. The plurality of central word lines 103 extend into the plurality of central semiconductor portions 111. The plurality of intermediate word lines 104 extend into plurality of first isolation portions 121. The edge word line 102 may be disposed around the central word lines 103 and the intermediate word line 104. The edge word line 102 may be disposed between the second isolation portion 122 and the intermediate word line 104. Alternatively, the edge word line 102 may be disposed between the second isolation portion 122 and the central word line 103.

In some embodiments, a width $W_5$ of the edge word line 102 may be greater than a width $W_0$ of the central word line 103 and a width $W_4$ of the intermediate word line 104. In some embodiments, a depth D of the edge word line 102 may be substantially equal to a depth $D_0$ of the central word line 103.

Figure 21:
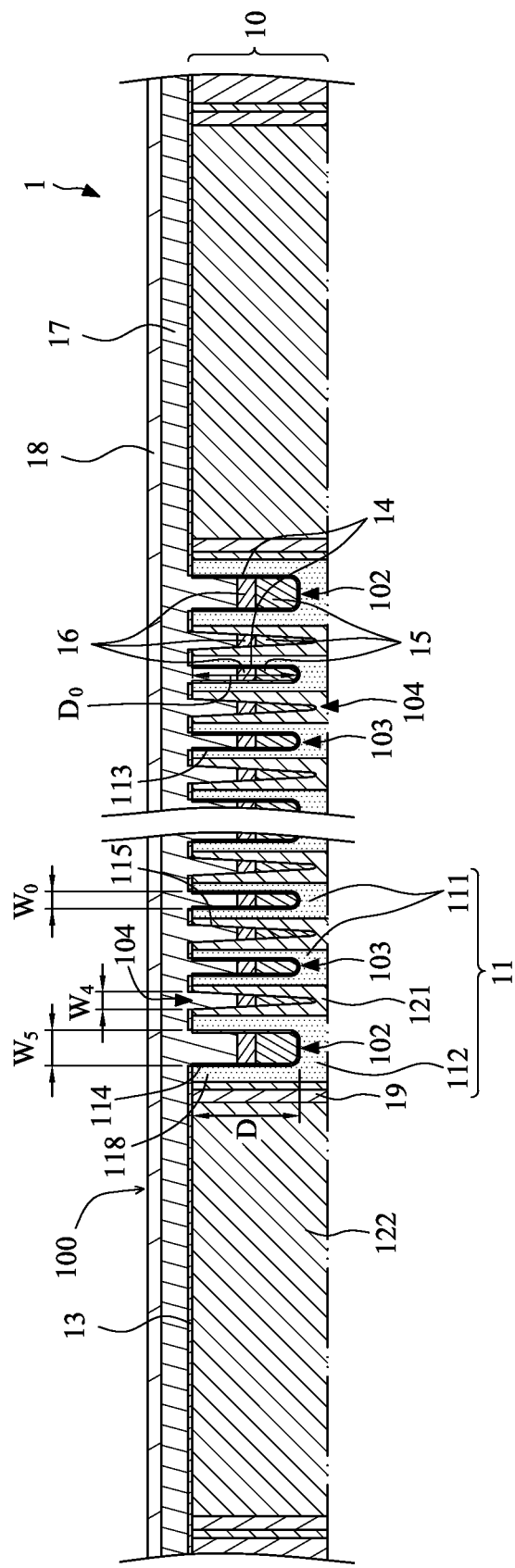
FIG. 21 illustrates a cross-sectional view of one or more stages of an example of a method of manufacturing a semiconductor structure according to some embodiments of the present disclosure.

Referring to FIG. 21, a gate layer 18 is formed on and covers the nitride layer 17 to obtain the semiconductor structure 1. The gate layer 18 may include, for example, oxide. In some embodiments, the semiconductor structure 1 may be a semiconductor device that includes a circuit, such as a memory cell. In some embodiments, the memory cell may include a dynamic random access memory cell (DRAM cell).

In addition, the semiconductor structure 1 may be or include a portion of an integrated circuit (IC) chip that includes various passive and active microelectronic devices, such as resistors, capacitors, inductors, diodes, p-type field-effect transistors (pFETs), n-type field-effect transistors (nFETs), metal-oxide semiconductor field-effect transistors (MOSFETs), complementary metal-oxide semiconductor (CMOS) transistors, bipolar junction transistors (BJTs), laterally-diffused MOS (LDMOS) transistors, high-voltage transistors, high-frequency transistors, fin field-effect transistors (FinFETs), other suitable IC components, or combinations thereof.

As shown in FIG. 21, the at least one active area moat 118 may be adjacent to an active area 100 of the semiconductor structure 1.

As shown in the embodiments illustrated in FIG. 1 through FIG. 21, the photomask 30 (FIG. 2) is improved to define the plurality of central openings 203, the at least one first edge opening 201 and the at least one second edge opening 202 on the sacrificial structure 20 (FIG. 4). In addition, the thickness T of the second material layer 52 (FIG. 11) is reduced to define the at least one through hole 2024 (FIG. 12) having an increased space (or width). Then, the improved edge word line 102 (FIG. 21) can be obtained through the at least one through hole 2024. The improved edge word line 102 (FIG. 21) has an increased width (e.g., the width W) and a deepened depth (e.g., the depth D) to extend channel lengths of edge transistors and prevent a generation of a short-pass channel to the at least one active area moat 118 (FIG. 21). Thus, no additional leakage path will appear.

In a comparavtive embodiment, the word lines may be arranged in an array. However, after fabrication, the depth of the word lines at the array edge may be less than the depth of the word lines at the array center. That is, the transistors adjacent to the array edge will have shorter channel lengths. Thus, the transistors adjacent to the array edge are easily turned on and generate a short-pass channel to active area moats, causing an additional leakage path.

Figure 22:
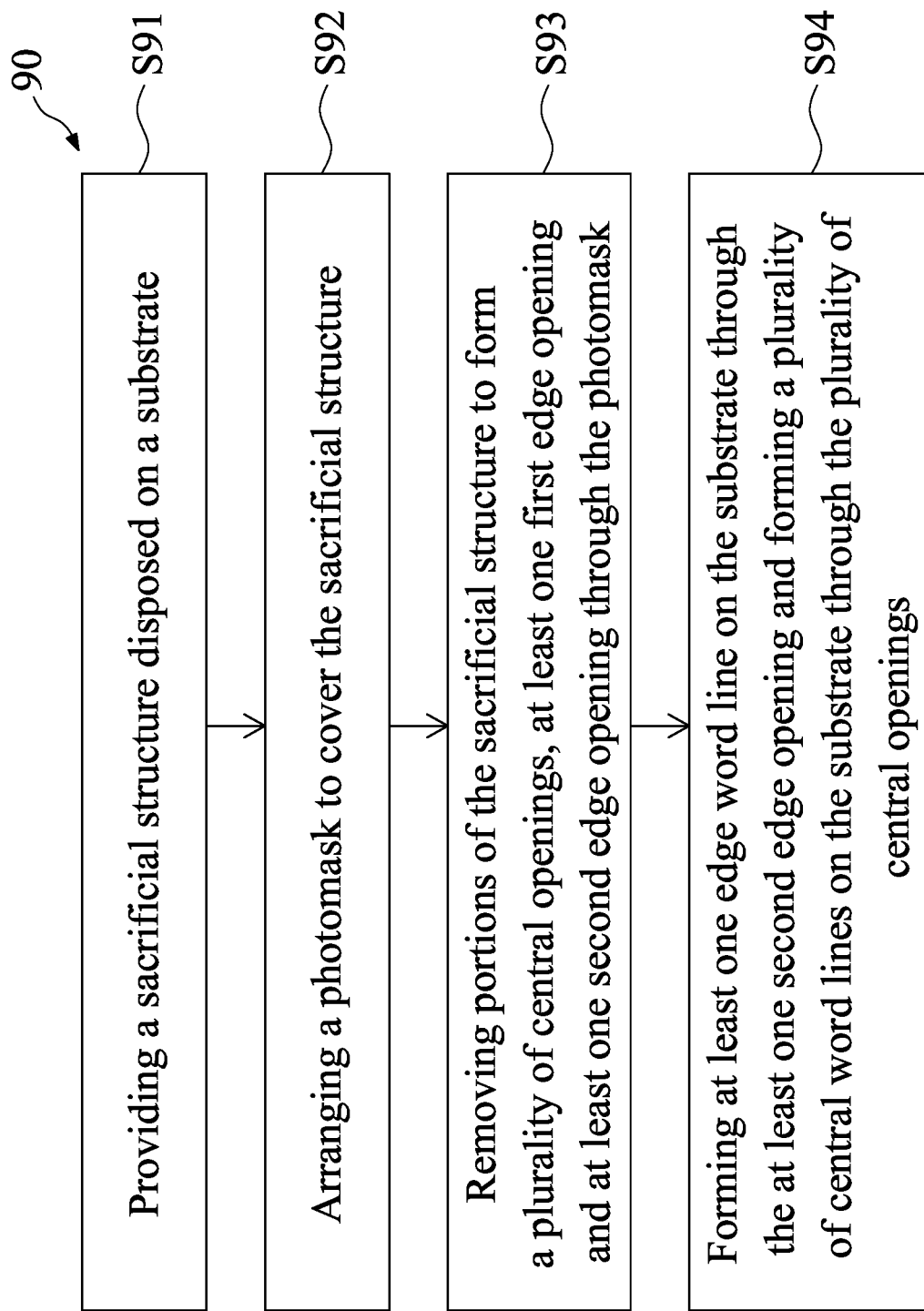
FIG. 22 illustrates a flow chart of a method of manufacturing a semiconductor structure according to some embodiments of the present disclosure.

FIG. 22 illustrates a flow chart of a method 90 of manufacturing a semiconductor structure according to some embodiments of the present disclosure.

In some embodiments, the method 90 can include a step S91, providing a sacrificial structure disposed on a substrate. For example, as shown in FIG. 1, the substrate 10 and the sacrificial structure 20 are provided. The sacrificial structure 20 is disposed on the substrate 10.

In some embodiments, the method 90 can include a step S92, arranging a photomask to cover the sacrificial structure. For example, as shown in FIG. 2, the photomask 30 is arranged to cover the sacrificial structure 20.

In some embodiments, the method 90 can include a step S93, removing portions of the sacrificial structure to form a plurality of central openings, at least one first edge opening and at least one second edge opening through the photomask. For example, as shown in FIG. 4, portions of the sacrificial structure 20 are removed to form the plurality of central openings 203, the at least one first edge opening 201 and the at least one second edge opening 202 through the photomask 30.

In some embodiments, the method 90 can include a step S94, forming at least one edge word line on the substrate through the at least one second edge opening and forming a plurality of central word lines on the substrate through the plurality of central openings. For example, as shown in FIG. 4 through FIG. 20, the at least one edge word line 102 is formed on the substrate 10 through the at least one second edge opening 202 and the plurality of central word lines 103 are formed on the substrate 10 through the plurality of central openings 203.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor structure, comprising:
   providing a sacrificial structure disposed on a substrate;
   removing portions of the sacrificial structure to form a plurality of central openings, at least one edge opening and a plurality of pillars spaced apart from each other;
   forming a first material layer to cover the plurality of pillars, the plurality of central openings and a portion of the at least one edge opening, wherein a thickness of the first material layer is less than a height of the plurality of pillars; and
   forming at least one edge word line on the substrate through the at least one edge opening and forming a plurality of central word lines on the substrate;
   wherein after forming the first material layer, the method further comprises:
   removing portions of the first material layer to expose top surfaces of the plurality of pillars and to form at least one through hole in the at least one edge opening;
   wherein after exposing the top surfaces of the plurality of pillars, the method further comprises:
   removing the plurality of pillars to form a plurality of grooves, wherein the plurality of grooves includes a plurality of central grooves and a plurality of edge grooves, and the at least one through hole is between the plurality of central grooves and the plurality of edge grooves;

wherein the central word lines are on the substrate through the central grooves;

wherein after forming the plurality of grooves, the method further comprises:

forming a second material layer to cover the plurality of edge grooves;

wherein after forming the second material layer, the method further comprises:

forming at least one edge trench on the substrate through the at least one through hole and forming a plurality of central trenches on the substrate through the plurality of central grooves, wherein a width of the at least one edge trench is greater than a width of the plurality of central trenches.

2. The method of claim 1, wherein a depth of the at least one edge trench is substantially equal to a depth of the plurality of central trenches.

3. The method of claim 1, wherein after forming the at least one edge trench and the plurality of central trenches, the method further comprises:

forming the at least one edge word line in the at least one edge trench and forming the plurality of central word lines in the plurality of central trenches.

\* \* \* \* \*